United States Patent

[11] 3,615,469

[72] Inventor Floyd L. Ramp
West Richfield, Ohio
[21] Appl. No. 837,987
[22] Filed June 2, 1969
[45] Patented Oct. 26, 1971
[73] Assignee The B. F. Goodrich Company
New York, N.Y.

[54] POLYMERIC PRINTING PLATES
19 Claims, No Drawings

[52] U.S. Cl. .......... 96/36.3, 204/159.18
[51] Int. Cl. .......... G03c 5/00
[50] Field of Search .......... 96/36, 36.3; 204/159.18, 160.1

[56] References Cited

UNITED STATES PATENTS 3,175,992 3/1965 Anderson .......... 204/159.18
2,184,311 12/1934 Meigs .......... 96/36.3

*Primary Examiner*—Norman G. Torchin
*Assistant Examiner*—Edward C. Kimlin
*Attorneys*—J. Hughes Powell, Jr. and Ernest K. Bean

ABSTRACT: A method for producing etched rubber products for use in printing wherein cured rubber products formed from diolefin polymer compounds are treated with aromatic nitrocompounds, masked and exposed to light to selectively degrade the exposed areas. The degraded material is removed leaving the unexposed area as a raised surface.

POLYMERIC PRINTING PLATES

BACKGROUND OF THE INVENTION

Various rubber products such as flexible printing plates, art work, printed circuitry and the like have relief images. Printing plates, having raised printing surfaces, are normally produced from engraved molds. An image is first inscribed on a metal plate, transferred to a mold plate and, thereafter, a flexible polymeric plastic or rubber is impressed against the mold plate so as to transfer reverse impressions of the mold plate to the polymeric plastic or rubber. Preparation of metal plate and mold plates to produce flexible printing plates are time consuming and costly. Accuracy and fine detailed copy are difficult to reproduce satisfactorily. Methods to provide improved reproductions at low cost are desired in this art. The printing industry has a need for more readily produced etched surfaces of improved detail particularly suitable for use as flexible printing plates.

SUMMARY OF INVENTION

This invention relates to a method of producing etched rubber products from photosensitive diolefin polymer compounds. Improved flexible printing plates can be produced by an improved process that eliminates the necessity of first producing a metal plate and a master plate mold, and further provides increased accuracy to be obtained in reproducing detailed copy. Conjugated diolefin polymers are treated with aromatic nitrocompounds to make the polymers sensitive to degradation by light. The combination of light with the aromatic nitrocompounds degrades the exposed portion of the diolefin polymers causing the polymer to become softer and more soluble in solvents. The degraded polymeric materials are removed as with solvents leaving nonexposed nondegraded areas as raised surfaces. Increased commercial versatility and utility are achieved by producing flexible printing plates in accordance with this invention.

DETAILED DESCRIPTION OF INVENTION

In accordance with this invention, polymeric diolefin compounds are treated with aromatic nitrocompounds whereby they become sensitive to certain lightwaves which effectively degrade the exposed sensitized polymers. Using cured or vulcanized compounds, one obtains sharper etchings and printing plates resistant to wear on long usage.

The diolefin polymers used in the practice of this invention include those polymers prepared by polymerizing conjugated diolefins containing 4 to 10 carbon atoms such as butadiene-1,3; isoprene; 2-ethyl butadiene—1,3;2,3-dimethyl butadiene-1,3; myrcene; 1-cyanobutadiene-1,3; 2-chlorobutadiene-1,3; and the like. While homopolymers such as poly (isoprene), poly (butadiene) and natural rubber are preferred, copolymers of these diolefins with one another or with one or more unsaturated vinylidene monomers having at least one terminal $CH_2C<$ group copolymerizable therewith such as styrene, substituted styrenes, acrylic and methacrylic acids and their esters, amides and nitriles, vinyl pyridine and other unsaturated vinyl and vinylidene monomers well-known to those skilled in the art in amounts preferably less than 50 percent of the total diolefin and vinylidene monomers may be used. Preferred polymers are natural rubber and homopolymers of alkyl substituted butadiene-1,3 including, for example, poly(cis-1,4-isoprene), poly(2-ethylbutadiene), poly(2,3-dimethylbutadiene) and block or random copolymers of more than 50 percent isoprene and styrene and 2,3-dimethylbutadiene and styrene, and the rubber hydrochloride of poly(cis-1,4-isoprene) and natural rubber. Synthetic and natural poly(cis-1,4-isoprene) have been found to be particularly suitable for commercial use.

Curing systems to obtain a cured or vulcanized polymer may be any of those known to those skilled in the art including the peroxides, sulfur, and the like capable of curing or vulcanizing the unsaturated polymers. Various suitable vulcanizing systems are described in Fisher, "Chemistry of Natural and Synthetic Rubbers" (Reinhold Publishing Corp. 1957).

Any organic peroxide curing agents well known in the art are used. For example, benzoyl peroxide, dicumyl peroxides, 2,5-bis (t-butylperoxy)-2,5 dimethylhexane, t-butyl perbenzoate, di-t-butyl peroxide, 2,2-di-(t-butylperoxy) butane and the like are suitable curing agents. It is preferred that the peroxides be essentially compatible with the diolefin polymer so as to yield essentially clear polymeric mixtures. Hazy polymeric mixtures tend to reduce the effectiveness of exposure to light and subsequently retard polymer degradation.

Amounts of peroxide depend on various factors familiar to those skilled in the art. For example, peroxide levels are affected by acidic additives which tend to destroy the effectiveness of peroxides. Excessive amounts of peroxide yield tightly cured rubber stocks which give shallower relief of images formed. A deficiency of peroxide results in loss of detail in the image. Accordingly, peroxide additions may range from about 0.05 to 5.0 parts by weight of peroxide to 100 parts by weight of polymer. The preferred range of peroxide is about 0.1 to 2.0 parts by weight of peroxide per 100 parts by weight of polymer. Typical catalysts and the amounts utilized are illustrated in the examples.

Known curing systems using a sulfur cure compatible with sensitizing solutions utilized are also suitable for commercial use. Preferably, at least about 0.1 weight parts of sulfur should be added to 100 weights parts of polymer and, desirably, about 0.5 to 3 weight parts of sulfur are added. Low temperature sulfur curing systems permit sensitizers to be intermixed with polymers in a compounding stage and, accordingly, eliminates applying sensitizers to polymer surfaces after the polymer has been cured. Suitable polymeric mixtures having a sulfur curing system compatible with suitable sensitizers are given in the examples. Deviations therefrom may be made as are well known to those skilled in the art.

Sensitizers found to be particularly advantageous are aromatic nitrocompounds characteristically having a $—NO_2$ group attached to an aromatic ring. Preferred aromatic nitrocompounds are nitro benzene derivatives having a generalized structural formula of

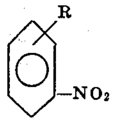

wherein R is H or a substituent being an electron donating group or a substituent being an electron withdrawing group having an inductive effect on the benzene ring. Theory related to the inductive effect of various radicals attached to the benzene ring is discussed by Fieser and Fieser in "Advanced Organic Chemistry," Chapter 17 (Reinhold Publishing, 1961). Preferrably, R is an alkyl constituent having 1–20 carbon atoms, a —COOR′ group wherein R′ is an alkyl group having 1–20 carbon atoms, a halogen, or a disubstituted amide. Suitable aromatic nitrocompounds include, for example: 0-nitrotoluene; 1-ethyl-2-nitrobenzene; N,N-diethyl-p-nitrobenzamide; N,N-di-n-butyl-p-nitrobenzamide; 1-chloro-4-nitrobenzene; ethyl-m-nitrobenzoate; p-nitrotoluene; alkyl nitrobenzenes wherein the alkyl group has from 1–20 carbon atoms; 1-bromo-3-nitrobenzene; p-nitro-benzonitrile; and like nitrobenzene derivatives. Particularly effective aromatic nitrocompounds are nitrobenzene derivatives having R— substituents attached to the benzene ring meta or para to the —$NO_2$ group, for example, nitrobenzene, m-nitro-toluene, p-nitro ethylbenzene, ethyl-p-nitrobenzoate, neo-pentyl p-nitrobenzoate, and octyl-p-nitrobenzoate.

Aromatic nitrocompounds comprising derivatives of condensed aromatics are effective sensitizers. However, derivatives of condensed aromatics are less effective sensitizers than benzene derivatives. Condensed aromatics include, for example, 1-nitronapthalene, nitroanthracene, and nitrophenanthrene.

The aromatic nitrocompounds are normally utilized as liquids or as solutions thereof capable of wetting the polymeric compound surface. Aromatic nitrocompounds in fluid form may be readily applied as a thin film by a suitable means, such as roller coating or brushing. At least about 0.2 grams of aromatic nitrocompound should be applied to about 100 square inches of polymeric surface to achieve etched surfaces suitable, for example, for granvre printing plates. Preferably, at least about 1.0 gram up to about 10 grams of aromatic nitrocompound is applied to about 100 square inches of polymeric surfaces although greater amounts are not necessarily detrimental. Lesser amounts produce shallower etching. The aromatic nitrocompounds are preferably applied to the surface to be exposed and etched. However, acceptable results are achieved by applying sensitizer to the opposite surface in thin clear sections. Application to the opposite surface necessitates the aromatic nitrocompound to sufficiently diffuse through the polymeric compound prior to being exposed to light, which diffusion normally takes about 16 hours at room temperatures.

Solid aromatic nitrocompounds are dissolved in suitable solvents capable of dissolving the particular aromatic nitrocompound utilized. Preferred solvents have a boiling point greater than 65° C. and are capable of wetting the polymeric surface. The preferred solvents have some swelling effect on the cured polymers so as to enhance diffusion of the dissolved sensitizer into the polymeric compound and provide enhanced mobility of sensitizer within the polymeric matrix. Carrier solvents which are photochemically inert and do not substantially absorb light in the near ultraviolet region are further desirable. Accordingly, xylene has been found to be a particularly suitable carrier solvent. If desired, liquid sensitizers may be solvated in the same manner to achieve comparable results. Other suitable solvents include, for example, ethyl benzoate, decahydronaphthalene ($C_{10}H_{18}$–Decalin), benzene, heptane, hexane, xylene, dicyclopentadiene, 2-methyl-2 pentane and the like.

The aromatic nitrocompound sensitizers may be mixed directly with the polymers. If added to a vulcanizable compound during compounding prior to vulcanization, the compound may be cured at temperatures up to 275° F. and preferably up to 225° F. so as to avoid having aromatic nitrocompounds react with the polymers. Aromatic nitrocompounds should not react with curing catalysts. Accordingly, sulfur cure systems are particularly preferred for systems incorporating sensitizers into the polymeric mixtures during the compounding stage. At least about 0.5 up to 20 weight parts of aromatic nitrocompound should be added to 100 weight parts of polymer and, preferably, about 2 to 6 weight parts of aromatic nitrocompound is mixed with the polymer.

Sensitized polymeric compounds are selectively exposed to certain light as described hereinafter. Selective exposure is achieved by transmitting lightwaves through a suitable masking means, such as transparencies, photographic negatives, pattern cutouts and the like which permit selective exposure by substantially screening out lightwaves in the range of 3100 to 4300 A. in the areas not to be etched. Although the type of light source is not critical, light sources should have some light wavelengths ranging from about 3,100 A, to 4,600 A. Suitable light sources having the desired range of lightwave output include, for example, mercury arc lights (AH 6), R.S. Sunlamp (275 watts), medium or high pressure mercury arcs such as Hanonia lamp 679 A and Mercury Reprographic lamp H3T7, tubular Metal Halide lamps such as MP 1,500 T4/12B and MG 1,500 T4/12B, high intensity fluorescent lamps, and carbon arcs such as Strong Electric lamps of the type used in the graphic arts industry. The light source should preferably have at least about 1 percent of the lightwaves ranging from about 3,100 A. to about 4,300 A.

Required exposure times to certain light is dependent upon the intensity of the light source and the cross-linking density or state of vulcanization of the polymer. Exposure times increase with decrease in light intensity and, accordingly, about 5 to 60 minutes exposure times are generally satisfactory. Desirably, light intensity measured at the polymeric surface should be the equivalent of about 1 X watt per lineal inch of exposure lamp. Shorter exposure times of about 2 to 5 minutes may be achieved by exposing moderately cured polymers to intense ultraviolet light sources having an intensity of at least about 2 watts per lineal inch of exposure lamp. Typical light sources spaced at varying distances from the polymeric surface are illustrated in he examples.

Degraded polymeric matter is moderately pliable and has a consistency comparable to stiff grease. Degraded polymeric matter is removed leaving an etched surface. Degraded polymeric matter may be removed by solvent washing aided by a moderate mechanical brushing means, described hereinafter. Washing solvents characteristically being nonpolar organic solvents are capable of dissolving degraded polymeric matter. Suitable washing solvents are generally solvents miscible in mineral oil in all proportions. Suitable solvents include, for example, hexane, ethylene dichloride, methylene chloride, toluene, high molecular weight esters, alcohols and ketones. Ethylene dichloride is a preferred commercial solvent. A brushing means is normally used in conjunction with washing solvents to effectively remove degraded polymeric matter. Cured and nondegraded polymeric compositions surrounding the degraded matter is substantially resistent to vigorous brushing. Accordingly, a wide variety of brushing means may be employed. Desirable brushing means have resilient bristles ranging in stiffness from soft and flexible to semirigid. Alternatively, suitable washing solvents may be utilized as high pressure sprays having an abrasive, such as fine silica, dispersed therein. Depending on the type solvent utilized, some hydrocarbon solvents may tend to swell the polymer mixture. Swelling is not necessarily adverse, however, since deswelling of polymeric compounds can be effected by post-washing with isopropyl alcohol.

After the degraded polymeric matter is removed by a solvating process, the etched products are dried to remove the washing solvents and may then be used. For example, dried flexible printing plates may have printing ink applied thereto and are suitable for reproducing printed copy.

The polymers may be mixed with the usual compounding materials such as certain mineral fillers and modifying polymers. For example, it may be desirable to modify diolefin polymers to increase the hardness and abrasion resistance of cured polymers. Mineral fillers and polymeric modifiers preferably should yield clear polymeric mixtures so as to achieve maximum light transmission and at least be translucent. When mineral fillers are added in large amounts, it may be desirable to add processing aids such as zinc stearate or a sodium salt of tall oil fatty acid. If mineral fillers are used, however, they should be added in limited amounts so as to maintain a continuous matrix of elastomeric material. Mineral fillers found to be suitable include, for example, silica, finely divided glass, magnesium carbonates and magnesium oxide. Amounts and types of mineral fillers are further illustrated in the examples. Normally, less than 50 parts filler based on 100 parts polymer will be used.

The polymers may be further modified with resinous additives, if desired. Resinous additives are added to the polymers to enhance the physical properties thereof, for example, for increasing abrasion resistance and increasing hardness. Preferred resinous additives are polymeric plastic materials having a softening point greater than about 50° C. Suitable resinous modifiers include, for example, copolymers of styrene, acrylonitrile, and methyl methacrylate with each other and other vinylidene monomers. The resinous additives should be essentially compatible with the diolefin polymers so that blends thereof are substantially translucent to near ultraviolet light. Resinous additives are finely dispersed in the diolefin polymer, such as by blending latices of resins and diolefin polymer. Suitable polymeric modifying additives may be added provided the concentration of polymeric modifier does not form a continuous matrix and, thereby upset the continuity and physical properties of the diolefin polymer. The maximum amount of polymeric modifiers that may be added is dependent upon the type and state of dispersion of polymeric modifier, however, generally up to about 30 weight parts polymeric modifier may be added to 100 weight parts of diolefin polymer.

Elastomeric modifiers may also be added to diolefin polymers provided the elastomeric modifier is essentially compatible therewith permitting the blended mixture to be substantially translucent to near ultraviolet light. Suitable elastomeric modifiers include, for example, neoprene, cis-1,4-polybutadiene, copolymers of butadiene with vinyl monomers such as styrene, acrylonitrile and methyl methacrylate, acrylonitrile-butadiene rubbers, block styrene-butadiene rubbers, acrylate rubbers, chlorosulfonated polyethylene polymer and copolymers of ethylene-propylene, butyl rubber, polyepichlorohydrin rubber and the like. Preferred elastomeric modifiers are acrylonitrile-butadiene rubbers, neoprene rubbers and cis-1,4 polybutadienes which elastomeric modifiers enhance the sharpness of detail of images produced. Elastomeric modifiers should be added in amounts so as to permit the diolefin polymer to prevail as a continuous matrix. Illustrative amounts of elastomeric modifiers that may be added to polymers are shown in the examples.

Curing catalysts, mineral additives, resinous additives and elastomeric additives are intermixed with diolefin polymers by a mixing means, such as a Banbury mixer or a roll mill and in solution or dispersion. This polymeric mixture is then formed into desired configurations depending on the end product desired. To produce printing plates, for example, polymeric mixtures are formed into flat sheets and cured with heat. Suitable sheet forming processes are utilized, such as a calendering process. Heat may be applied during the forming process to impart flowability to the polymeric compound. However, such heat should not increase temperatures of polymeric mixtures above about 175° F. so as to not prematurely activate curing agents and prematurely cure polymeric mixtures during the sheet forming stage. Sheets formed for printing plates should have uniform thicknesses with a maximum variance in sheet thickness of about ± 0.002 inches and preferably ± 0.0005 inches, particularly for use in fine detailed printing.

Free radical formation by peroxide is temperature dependent, promoting cross-linking polymerization of diolefin polymers. Free radical vulcanization is a technique well known in the art as noted by Van der Hoff (Polymer Preprints, 2, No. 2, 1461 [1967]). Generally, application of heat to about 300° F. for about 45 minutes is sufficient. Typical catalysts are illustrated in the examples.

While etched products may be prepared from noncross-linked polymers as described herein, excellent results are obtained when the polymers are cross-linked by techniques known to those skilled in the art, either before or after combination with the aromatic nitrocompound as described. In addition to vulcanization, cross-linked or gelled polymers may be obtained by many techniques. The most obvious is the formation of cross-linking or gel during polymerization. In the free radical induced emulsion polymerization of such monomers as isoprene, cross-linking or gelling normally occurs in the higher ranges of conversion and if gel-free polymers are desired, modifiers are generally added. If gel is desired, the amount of modifier is reduced. While in the commercial production of poly(cis- 1,4-isoprene) with reduced metal Ziegler type catalysts, there is little gel formed unless the conversion is exceedingly high when a dry system is employed. However, the presence of small amounts of water during such polymerization will lead to polymers containing gel. Cross-linked polymers are also obtained during polymerization or after polymerization through the use of gel-inducing monomers.

To obtain cross-linked or gelled polymers through the use of cross-linking or gel-forming monomers, the monomer in amounts as low as 0.1percent of the total monomers of such cross-linking monomers may be present during the polymerization reaction, added at the end of the polymerization reaction, or may be added to the dry polymer or solutions thereof. For example, in the emulsion polymerization of isoprene with the standard redox catalyst, 0.01 to 2 percent of a cross-linking monomer as described hereinafter will cause substantial gel formation. Cross-linking may be induced in dry poly(cis-1,4-isoprene), for example, by swelling solid poly(cis-1,4-isoprene) with a solution of divinyl benzene and benzoyl peroxide and heating. Cross-linked or gelled poly(cis-1,4-isoprene) may also be obtained by dissolving the poly(cis-1,4-isoprene) in benzene adding a cross-linking monomer and peroxide thereto and heating.

Suitable gel-inducing monomers for use in producing the gelled polymers are divinyl benzene, divinyl ether, diallyl fumarate, diallyl phthalate, divinyl sulfone, divinyl carbitol, the monomeric acrylic polyesters of polyhydric alcohols and an acrylic acid selected from the class consisting of acrylic and methacrylic acids and containing at least two, and preferably from 2 to 6, acrylic ester groupings per polyester molecule, such as diethylene glycol diacrylate, diethylene glycol dimethacrylate, trimethylene glycol diacrylate, butylene glycol diacrylate, pentadimethylene glycol diacrylate, glyceryl diacrylate, glyceryl triacrylate, octylene glycol diacrylate, trimethylol propane triacrylate, trimethylol propane trimethacrylate, the tetraacrylate ester of pentaerythritol, and others, and the polyalkenyl polyethers of polyhydric alcohols in which the double bonds of the alkenyl ether groups are each present in the vinylidene $CH_2$=C< group such as are produced by the Williamson synthesis in which a suitable alkenyl halide such as allyl bromide is reacted with an alkaline solution of a polyhydric alcohol, especially 1,2,3-butane triol and the polyhydric alcohols derived from sugars and related carbohydrates such as sucrose, maltose, fructose, and the like. An illustrative monomer of this latter type being a polyallyl ether of sucrose containing 2,3,4 or more allyl ether groups per molecule, and others.

The amount of cross-linking or gel is not critical and as little as 1 percent gel will shown improvement in the etched rubber products. While products containing 100 percent gel may be satisfactory under some conditions, difficulty in processing is encountered in that smooth sheets are not readily obtained, one would use a polymer containing less than 100 percent gel or use processing aids. The nature of the gel may contribute to problems of processability, loose gel causing less processing difficulty than the so-called tight gel. It should be understood also that such cross-linked or gelled polymers in addition may be cured or vulcanized as described herein.

Cured flat sheets or other desired configurations are suitable for producing etched rubber products. Flat sheets, suitably formed, are then heat cured at temperatures depending upon the during system utilized. For producing printing plates, cured flat sheets may be used alone or as a face ply. A flat sheet used as a face ply normally is supported by a polymeric backing material resistant to hydrocarbon and chlorinated solvents. Neoprene W, for example, vulcanizes well with low levels of peroxide and is particularly suitable. For nonresilient applications, a metallic backing such as aluminum plate is desirable. The face ply may be adhered to the desired backing material during the process of curing the face ply, or alternatively the face ply may be adhered to the backing by suitable adhesives after the face ply has been cured.

The cured face ply, backed or unbacked is treated with aromatic nitrocompounds to sensitize the face ply to light. For commercial production of etched printing plates, aromatic nitrocompounds are normally applies to the surface to be exposed.

Selective exposure is achieved by transmitting light through a suitable masking means, such as transparencies, photographic negatives, pattern cutouts, and the like. A high contrast negative, for example, has been found to be particularly suitable. The temperature at the surface being exposed should be from about 32° F. up to about 300° F. and ordinarily should be about 100° F. to 225° F. Light sources emitting substantial amounts of lightwaves less than 3,100 A. tend to darken the transparency. A protective glass, such as lime glass or Pyrex glass, may be placed over the transparency prior to exposure which protective glass filters out wavelengths less than 3,100 A. and protects the transparency.

The foregoing description is for clearness in understanding of the process of this invention and modifications thereof will be obvious to those skilled in the art. The following examples and discussion will further illustrate this invention. All parts indicated are by weight unless otherwise noted.

EXAMPLE 1

Using a Banbury mixer, the following components were mixed to form a uniform mixture.

100 parts synthetic cis-1,4-polyisoprene
1 part triethanolamine
5 parts N-octadecyl-1,3-diamino propane (Armeen TD)
20 parts Silica (HiSil No. 233 )
0.25 part Dicumyl peroxide (Dicup R)

The uniform mixture was then calender formed into a flat sheet having a thickness of 0.125 inches and a variance of about ± 0.002 inches. The mixture was heated to about 150° F. to aid forming. The formed flat sheet was cured at about 350° F. for 45 minutes. About 1.5 grams of a solution (25 grams of ethyl *p*-nitrobenzoate dissolved in 100 grams xylene) was brushed onto 100 square inches of the flat sheet surface and allowed to dry for about 1 hour at room temperature. A high contrast negative was placed on the sensitized surface. This surface was selectively exposed for about 45 minutes to R.S. Sunlamp (275 watts) placed at a distance of about 6 inches. The exposed areas of the flat sheet were degraded yielding about 0.025 inches depth of relief. The degraded polymeric matter was removed with hexane solvent in conjunction with moderate brushing action of flexible bristled scrub brush. The etched flat sheet was air dried. Printing ink was applied to the raised surface which reproduced detailed positive copy of printing.

EXAMPLE 2

Using a roll mill the following components were mixed to a uniform mixture.

100 parts (wt.) cis,-1,4-polyisoprene (Natsyn 400)
20 parts (wt.) cis-1,4-polybutadiene
20 parts (wt.) silica filler
2 parts (wt.) triethanolamine
0.8 part (wt.) 2,5-bis (t-butyl peroxy)-2,5dimethylhexane (Varox)
5 parts zinc stearate The uniform mixture was formed into a flat sheet in the manner of example 1 and was cured for about 45 minutes at 300° F. About 1.0 grams of the sensitizer solution of example 1 was roller coated to 100 square inches of the flat surface. A high contrast negative was placed on the sensitized surface which was selectively exposed as in example 1. Results achieved were the same as example 1.

EXAMPLE 3

A Banbury mixer was used to mix the components of example 2 with the exception that 60 parts silica filler was included instead of 20 parts. Flat sheet was formed, cured, treated with sensitizer solution and exposed as in example 2. Results achieved were the same as example 2.

Flat sheets may be utilized as a face ply and combined with a suitable backing material forming a laminated structure. A face ply may be supported, for example, with resilient polymeric backing or by a rigid metallic backing such as aluminum plate.

Preparation of suitable polymeric backing materials are illustrated in example 4.

EXAMPLE 4

The following components were intermixed and formed into a flat sheet.

A. 50 parts polychloroprene (Neoprene W)
50 parts cis-1,4-polybutadiene
40 parts silica filler
2 parts triethanolamine
0.8 part Varox In like manner, the following components were mixed and formed into a flat sheet.

B. 50 parts (wt.) Neoprene W
50 parts (wt.) CB rubber
60 parts (wt.) Clay
5 parts (wt.) Magnesium oxide
0.4 parts (wt.) Varox Accordingly, these polymeric materials were found to be particularly suitable for resilient polymeric backing material when combined with face plies of examples1,2 and 3 and cured therewith to form a laminate.

EXAMPLE 5

Using a Banbury mixer the components of example 2, with the exception that natural poly(isoprene) was substituted for Natsyn 100 and that 10 parts Neoprene W was substituted for cis-1,4,-polybutadiene, were mixed to form a uniform mixture. The uniform mixture was calendered into a flat sheet as described in example 1. The flat sheet was utilized as a face ply and combined with polymeric backing material (example 4A) and cured at 300° F. for about 45 minutes. About 2 grams of a solution (25grams of ethyl- p-nitrobenzoate dissolved in about 100 grams hexane) was brush applied to about 100 square inches of surface of the face ply. A high contrast negative was placed on the surface of the face ply and a quartz glass plate was placed over the negative. The face ply was exposed for about 60 minutes to RS Sunlamp (275 watts) placed at about 6 inches from the face ply. The degraded polymeric matter was removed by washing with hexane solvent. Depth of relief obtained was about 0.016 inches leaving a raised surface which, having ink applied thereto, reproduced fine detailed copy of an image.

EXAMPLE 6

A laminate produced as described in example 5 was immersed in a bath comprising about a 2 percent solution by weight of ethyl-m-nitrobenzoate dissolved in hexane. After immersion for about 1 hour the laminate was removed from the solution and the hexane was allowed to evaporate. A high contrast negative was placed over the face ply and exposed to R.S. Sunlamp (275 watts). Relief of about 0.014 inches was obtained.

EXAMPLE 7

A mixture of the following components was prepared on a mill:

100 parts cis-1,4-polyisoprene (Natsyn 400 )
20 parts cross-linked copolymer of 20 parts styrene, 87 parts methyl methacrylate and 3 parts diethylene glycol diacrylate overpolymerized with 50 parts isoprene.
10 parts Neoprene W
2 parts triethanolamine
0.3 part Varox The mixture was formed into a flat sheet having a thickness of about 0.040 inches which was combined polymeric backing material (0.060 inches thickness) of the following composition.

50 parts Neoprene W
50 parts cis-1,4-polybutadiene
40 parts silica
2 parts triethanolamine
0.2 part Varox The respective layers were combined to form a laminate and cured at about 300° F. for about 45 minutes. About 7 grams of sensitizer solution (33 grams of ethyl-p-nitrobenzoate in 100 grams of xylene) was applied to about 100 square inches surface area of the laminate. The laminate was heated to about 170° F. and exposed at a distance of about 3 inches to two fluorescent lamps (F15T8BL). Relief of about 0.012 inches was obtained.

EXAMPLE 8

The following components were mixed into a uniform mixture.

100 parts (wt.) Natural rubber
30 parts (wt.) Butadiene-acrylonitrile copolymer (Paracril B)
3 parts (wt.) triethanolamine
20 parts (wt.) silica
5 parts (wt.) zinc stearate
1.2 parts (wt.) dicumyl peroxide The uniform mixture was calendered into a flat sheet having a thickness of 0.025 ± 0.001 inches in accordance with example 1. The flat sheet (face ply) was combined with steel sheet (foil) of 0.008 inches with Chemlok 205 and 220 adhesive. The laminate was then cured at about 350° F. for about 45 minutes.

a. About 4 grams of solution (35 grams octyl-p-nitrobenzoate per 100 grams xylene) was brush applied to 100 square inches surface of face ply. A pattern cutout was placed on the face ply. The face ply was exposed at a distance of about 9 inches to a 1,500 watt diazo lamp for about 20 minutes. Relief obtained was about 0.018 inches. Printing ink was applied to the raised surface which reproduced detailed positive copy of a picture image.
b. About 1.6 grams of m-nitrotoluene liquid was applied to about 100 square inches of face ply surface and exposed in accordance with the procedure set forth in (a). Relief of about 0.003 inches was obtained.
c. About 4.0 grams of solution (33 grams of m-nitrotoluene in 100 grams of xylene) was roller coated to about 100 square inches of face ply which was exposed in accordance with (a). Relief of about 0.009 inches was obtained.

EXAMPLE 9

The components of example 2, with the exception that 20 parts chlorosulfonated polyethylene (Hypalon 40) was substituted for poly(butadiene), were mixed to a uniform mixture. The uniform mixture was formed into a flat sheet and cured in accordance with the procedure of example 2. About 2 grams of solution (25 grams *m*-nitrobenzoate dissolved in 100 grams mixture of decalin and toluene) was brush applied to about 100 square inches of sheet surface. The sheet was exposed as in example 1 which produced a depth relief of about 0.016 inches.

EXAMPLE 10

The components of example 2, with the exception that 20 parts of nitrile-butadiene rubber (Hycar 1001) was substituted for poly(butadiene), were mixed to uniform mixture. The mixture was formed and cured in accordance with example 2. About 5 grams of solution (25 grams m-nitro-toluene in decalin) was brush applied to the back surface of the flat sheet. The solution was permitted to permeate the flat sheet for about 16 hours and come to equilibrium. The front surface of the flat sheet was then exposed to RS Sunlamp (275 watts) for about 1 hour. Degraded polymeric matter was removed with a toluene wash. A depth of relief of about 0.028 inches was obtained.

EXAMPLE 11

The polymeric composition of example 9, with the exception that 20 parts (wt.) acrylate rubber (Hycar 4021) was substituted for 20 parts of Hypalon 40, was formed, cured, sensitized and exposed in accordance with procedure set forth in example 9. Results achieved were identical to example 9.

EXAMPLE 12

The following components were mixed:
100 parts natural rubber latex
20 parts copolymer latex of 20 parts styrene and 80 parts methyl methacrylate The mixture of latexes was coagulated with about 400 parts of Ethanol. The coagulant was mixed with 20 parts cis-1,4-polybutadiene, 2 parts zinc stearate and 0.8 parts Varox. The polymeric compound was formed into a flat sheet as described in example 1. The face ply was combined with backing material of example 4B and was cured as a laminate at 300° F. for about 45 minutes. The laminate was immersed in a 2 percent solution (ethyl-p-nitrobenzoate in hexane solvent) for about 1 hour. The laminate was air dried overnight. A high contrast negative was placed on the surface which was exposed for about an hour to a 400 watt mercury arc at a distance of about 6 inches. Degraded polymeric matter was removed with hexane giving depth of relief of about 0.014 inches.

example 13

A laminate similar to example 12 with the exception that the ratio of natural rubber latex to copolymer latex in the face ply was changed to the following:

100 parts polymer solids of natural rubber latex
80 parts polymer solids of copolymer latex of 20 parts styrene to 80 parts methyl methacrylate The laminate was sensitized as described in example 12 and the results achieved were essentially the same as example 12.

EXAMPLE 14

The following components as indicated were mixed to a uniform mixture.

| | A | B | C | D | E | F |
|---|---|---|---|---|---|---|
| Cis-1,4-polyisoprene | 100 | 100 | 100 | 100 | 100 | 100 |
| Neoprene W | 10 | 10 | 10 | 10 | 10 | 10 |
| Silica | 50 | 50 | 50 | 50 | 50 | 50 |
| Zinc stearate | 5 | 5 | 5 | | 2.5 | 7.5 |
| Varox | 0.8 | 0.8 | 0.8 | 0.8 | 0.8 | 0.8 |
| Triethanolamine | | 1 | 3 | 2 | 2 | 2 |
| Depth of relief (inches) | 0.012 | 0.018 | 0.020 | 0.009 | 0.015 | 0.020 |

Each uniform mixture (A,B,C,D) was calendered into a flat sheet as described in example 1 and combined with polymeric backing of example 4A. The laminate was cured at 325° F. for about 45 minutes. About 7 grams of sensitizer solution (25 grams ethyl-*p*-nitrobenzoate dissolved in 100 grams of xylene) was brush applied to about 100 square inches of surface. A high contrast negative was placed on each sample which was exposed to a 450 watt mercury arc for about 1 hour. The degraded matter in the exposed area was removed with ethylene dichloride solvent.

EXAMPLE 15

Four test samples of example 14D were prepared (*a,b,c,d*) and treated with varying amounts of sensitizer solution (25 grams ethyl-*p*-nitrobenzoate per 100 grams of xylene) as indicated, which were brush applied to 100 square inches of face ply surface. Each test (*a,b,c,d*) has a sample exposed 1 day after the solution was applied, and a sample exposed 21 days after the solution was applied. A high contrast negative was placed on each sample and each sample was exposed for about 20 minutes in a twin-arc weatherometer. The degraded polymeric matter was removed with methylene chloride and the depths of relief obtained are indicated below:

| | Sensitizer solution per 100 square inches of surface | 1 day aging | 21 days aging |
|---|---|---|---|
| a. | 7.0 grams | 0.021 inch | 0.011 inch |
| b. | 9 grams | 0.021 inch | 0.015 inch |
| c. | 12 grams | 0.021 inches | 0.026 inches |
| d. | 14 grams | 0.021 inches | |

EXAMPLE 16

The following components were mixed to a uniform mixture. The aromatic nitrocompound, octyl-p-nitrobenzoate, was incroporated into the composition in the compounding stage. Two separate mixes, A and B, were initially provided so as to prevent a premature cure.

| | |
|---|---|
| MIXTURE A | |
| 100 parts | Natural rubber |
| 30 | Butadiene-acrylonitrile copolymer (Paracril B) |
| 20 | Silica |
| 10 | Zinc Stearate |
| 2 | Zinc oxide |
| 2 | Sulfur |
| 1 | Diphenyl Guanidine |
| MIXTURE B | |
| 100 parts | Natural rubber |
| 30 | Paracril B |
| 20 | Silica |
| 1.5 | Tetramethylthiurammonosulfide |
| 1.0 | Mercaptobenzothiazole |
| 5.0 | Octyl p-nitrobenzoate |

Mixtures A and B were mixed, calendered, formed into a flat sheet, and then adhered to steel using adhesive. The laminate was cured for 15 minutes at 212° F. A stencil was placed on the face ply surface which was then exposed to a 1,500 watt metal halide lamp. The degraded polymeric matter was removed with ethylene dichloride solvent. Depth of relief achieved was about 0.012 inches. Ink was applied to the raised surface which reproduced detailed printed copy.

EXAMPLE 17

The following indicated components were mixed to a uniform mixture which was calendered formed into flat sheets.

| | A | B | C |
|---|---|---|---|
| Natural rubber | 100 | 100 | 100 |
| Cis-1,4-polybutadiene | 10 | 10 | 10 |
| Zinc stearate | 5 | 5 | 5 |
| Zinc oxide | 1 | 1 | 1 |
| Sulfur | 2 | 2 | 2 |
| Mercaptobenzothiazole | 0.75 | 0.75 | 0.75 |
| Tetramethylthiurammonosulfide | 0.5 | 0.5 | 0.5 |
| Diphenylguanidine | 0.5 | 0.5 | 0.5 |
| Octyl-p-nitrobenzoate | | 5 | 5 |
| Silica | | | 20 |
| Relief (inches) | 0.009 | 0.004 | 0.004 |

a. Mixture 17A was cured at 212° F. for about 15 minutes. About 12 grams of solution (ratio of 25 grams octyl-p-nitrobenzoate in 100 grams xylene) was brushed applied to 100 square inches of ply surface. A high contrast negative was placed upon the sheet which was then exposed to a 15 watt diazo lamp.

b. Mixture 17B was mixed with octyl-p-nitrobenzoate, calendered formed into a flat sheet. The sheet was cured at 212° F. for 15 minutes and selectively exposed through a high contrast negative for about 30 minutes to a 1,500 watt continuous spectrum lamp.

c. Mixture 17C was compounded and tested in accordance with the procedure set forth in 17B.

EXAMPLE 18

The following components were mixed to a uniform mixture.

| | |
|---|---|
| 100 parts | Natural rubber |
| 30 | Nitrile rubber (Paracril B) |
| 3 | triethanolamine |
| 20 | silica |
| 5 | zinc stearate |
| 1.0 | Dicumyl peroxide |

The uniform mixture was calendered formed into a flat sheet of about 0.025 inches in accordance with example 1. The flat sheet was combined with polymeric backing material forming a laminate of a face ply and backing material of example 4A. The laminate was (a) cured for 15 minutes at 350° F. and, alternatively, (b) cured for 45 minutes at 300° F. Solutions containing the aromatic nitrocompound indicated were brush applied to sample laminates and selectively exposed as described in example 17A.

| 25% Solution (Xylene) | a. Relief | b. Relief |
|---|---|---|
| ethyl-p-nitrobenzoate | 0.009 inch | 0.009 inch |
| octyl-p-nitrobenzoate | 0.013 inch | 0.013 inch |
| dodecyl-p-nitrobenzoate | 0.017 inch | 0.017 inch |

EXAMPLE 19

The following components as indicted were mixed, formed into face plies of about 0.030 inches, combined with polymeric backing material and cured to form a laminate in accordance with example 2. About 10 grams of solution (25 grams ethyl-p-nitrobenzoate in 100 grams xylene) was brush applied to 100 square inches of surface. Each sample was selectively exposed through a high contrast negative to R.S. Sunlamp (275 watt) at a distance of 6 inches for about 1 hour.

| | A | B | C | D |
|---|---|---|---|---|
| Cis-1,4-polyisoprene (Natsyn 400) | 100 | 100 | 100 | 100 |
| Nitrile-butadiene (Hycar 1041) | 10 | 10 | 10 | 10 |
| Nitrile rubber (Paracril B) | | | 30 | 30 |
| Silica | 30 | 30 | 30 | 30 |
| Triethanolamine | 2 | 2 | 2 | 2 |
| Zinc stearate | 5 | 5 | 5 | 5 |
| Varox | .4 | 0.8 | 0.4 | 0.8 |
| Depth of relief | 0.030 | 0.019 | 0.024 | 0.014 |

EXAMPLE 20

The following components were mixed to a uniform mixture.

100 parts polyisoprene
2 parts palm oil fatty acid
5 parts zinc stearate
10 parts silica
1 parts triethanolamine
0.25 part dicumyl peroxide The mixture was formed into a face ply and cured in accordance with example 2. Upon cooling to room temperature *m*-nitrotoluene was applied to the face ply by absorption from a blotter saturated with *m*-nitrotoluene and placed on the surface of the face ply, which absorbing process required about 15 minutes. The laminate was selectively exposed through a high contrast negative to an RS Sunlamp (275 watts) for about 1 hour at a distance of about 6 inches. The exposed areas having been degraded were removed with hexane solvent yielding relief of 0.006 inches.

EXAMPLE 21

The following components were mixed to form a uniform mixture.

100 parts Natural rubber
3.0 parts triethanolamine
15.0 parts silica
5.0 parts zinc stearate
1.0 parts Dicumyl peroxide A face ply was calendered formed from the mixture, combined with steel backing using Chemlock 205 and 210 adhesive, which combination was cured for 15 minutes at 350° F. About 10 grams of solution (25 grams octyl-*p*-nitrobenzoate in 100 grams xylene) was brush applied to the face ply. The face ply was exposed to a 1,500 watt green metal halide lamp Exposure time was about 4 minutes. Upon removing degraded material, relief of about 0.012 inches was obtained.

EXAMPLE 22

The following components were intermixed to form a polymeric composition suitable for use in silk screen printing. To about 200 parts of natural rubber latex (BFG 60–457) was added an emulsion mixture comprising:

10 parts octyl-p-nitrobenzoate
0.5 parts lauric acid
10 parts water containing 0.5 parts of concentrated aqueous ammonia.

The latex mixture was applied to silk screen by a squeegee, dried, and then heated at 75° C. for about 2 hours. The silk screen was selectively exposed through pattern cutout to an R.S. Sunlamp. The exposed area was degraded and removed with turpentine washing solvent. Upon drying, ketone-based ink was squeegeed on the silk screen which reproduced on paper the image of the silk screen.

EXAMPLE 23

A natural rubber latex (BFG-60-457) was compounded with low temperature sulfur curing agents and was diluted with water to about 30 percent weight solids. The latex mixture was squeegee applied to silk screen, dried, and then cured at 75° C. for about 16 hours. About 5 grams of solution (25 grams octyl-*p*-nitrobenzoate in 100 grams xylene) was brush applied to 100 square inches surface. The silk screen was selectively exposed to an R.S. Sunlamp for about 15 minutes. The exposed area was degraded and then washed with turpentine. Water or alcohol ink was applied to the screen which reproduced the image on paper.

EXAMPLE 24

100 Natural rubber
50 HiSil
5 octyl-p-nitrobenzoate

A flat sheet was formed from a mill-mixed mixture of the above materials, selectively exposed for about 20 minutes through a high contrast printing negative to an R.S. Sunlamp (275 watts) at a distance of about 6 inches. Good relief of about 0.015 inches was obtained.

EXAMPLE 25

One hundred weight parts of natural rubber containing about 20 percent gel was milled with about 5 weight parts of octyl-p-nitrobenzoate, formed into a flat sheet, and selectively exposed through a high contrast negative for about 20 minutes to an R.S. Sunlamp (275 watts) at a distance of about 6 inches. The flat sheet was selectively degraded yielding a visible image.

Having been provided with illustrative compositions, those skilled in the art will be able to select proportions and combinations within the scope contemplated by this invention and produce specifically desired results. All obvious variations and modifications thereof are contemplated and are included within the spirit and scope of this invention as defined in the appended claims.

I claim:

1. A process for etching surfaces of rubber products, comprising exposing conjugated diolefin polymers combined with aromatic nitrocompounds to light having wavelengths of about 3,100 to 4,600 A., and removing the exposed areas.

2. The process of claim 1 wherein the conjugated diolefin polymers are cross-linked.

3. The process of claim 2 wherein the conjugated diolefin polymers are vulcanized.

4. The process of claim 2 wherein the aromatic nitrocompound has a $-NO_2$ group attached to an aromatic ring.

5. The process of claim 4 wherein the conjugated diolefin polymer is natural rubber or poly (cis-1,4-isoprene).

6. The process of claim 4 wherein the conjugated diolefin polymers are vulcanized with sulfur.

7. The process of claim 6 wherein the conjugated diolefin polymers are vulcanized with at least about 0.1 weight parts of sulfur per 100 weight parts of polymer.

8. The process of claim 7 wherein the conjugated diolefin compound is combined with at least about 0.5 up to 20.0 weight parts of aromatic nitrocompounds per 100 weight parts of polymer, and then curred at temperatures up to 275° F.

9. The process of claim 4 wherein the conjugated diolefin polymers are vulcanized with an organic peroxide.

10. The process of claim 9 wherein the conjugated diolefin polymers are vulcanized with at least about 0.05 up to 5.0 weight parts peroxide per 100 weight parts of polymer.

11. The process of claim 9 wherein the aromatic nitrocompound is applied to the surface of cured ploymers at least in the ratio of about 0.2 grams of aromatic nitrocompound per 100 square inches of polymer surface.

12. The process of claim 4 wherein the aromatic nitrocompound is a nitro benzene derivative having a structural formula of

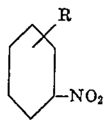

wherein R is meta or para to the $-NO_2$ group and R is H or a substituent having an inductive effect on the benzene ring.

13. The process of claim 12 wherein R is an alkyl group having 1 to 20 carbon atoms, a —COOR' group wherein R' is an alkyl group having 1 to 20 carbon atoms, a halogen, or a disubstituted amide.

14. The process in claim 5 wherein the aromatic nitrocompound is selected from the group of nitrobenzene, m-nitrotoluene, p-nitro-ethylbenzene, ethyl-p-nitrobenzoate, neopentyl p-nitro-benzoate, and octyl-p-nitrobenzoate.

15. The process in claim 4 wherein the cured conjugated diolefin is selected from the group consisting of natural rubber, synthetic poly(cis-isoprene), poly (2-ethylbutadiene), poly (2,3-dimethylbutadiene), block copolymers of isoprene and styrene, random copolymers of isoprene and styrene, copolymers of 2,3-dimethylbutadiene and styrene, and rubber hydrochlorides of cis-poly(isoprene).

16. The process of claim 1 wherein the exposed areas are removed with washing solvents.

17. The process of claim 13 wherein the conjugated diolefin polymer is natural rubber or poly (cis-1,4-isoprene) and is combined with at least about 0.5 weight parts of aromatic nitrocompound and at least about 0.1 weight parts of sulfur per 100 weight parts of polymer, cured at temperatures up to 275° F., and the exposed areas are removed by nonpolar hydrocarbon washing solvent.

18. The process of claim 13 wherein the conjugated diolefin polymer is natural rubber or poly(cis-1,4-isoprene) and is vulcanized with at least about 0.05 weight parts peroxide, aromatic nitrocompound is applied to the vulcanized polymer surface at least in the ratio of about 0.2 grams of aromatic nitrocompounds per 100 square inches of surface, and the exposed areas are removed with nonpolar hydrocarbon solvent.

19. An etched rubber product produced by exposing diolefin polymers combined with aromatic nitrocompounds to light having wavelengths of about 3,100 to 4,600 A., and removing the exposed areas.

* * * * *